(12) United States Patent
Lal et al.

(10) Patent No.: US 8,456,650 B2
(45) Date of Patent: Jun. 4, 2013

(54) OPTICAL GRID FOR HIGH PRECISION AND HIGH RESOLUTION METHOD OF WAFER-SCALE NANOFABRICATION

(75) Inventors: Amit Lal, Ithaca, NY (US); Norimasa Yoshimizu, Ithaca, NY (US)

(73) Assignee: Cornell University, Ithaca, NY (US)

( * ) Notice: Subject to any disclaimer, the term of this patent is extended or adjusted under 35 U.S.C. 154(b) by 165 days.

(21) Appl. No.: 13/062,832

(22) PCT Filed: Sep. 9, 2009

(86) PCT No.: PCT/US2009/056400
§ 371 (c)(1),
(2), (4) Date: Jun. 23, 2011

(87) PCT Pub. No.: WO2010/030698
PCT Pub. Date: Mar. 18, 2010

(65) Prior Publication Data
US 2011/0249275 A1    Oct. 13, 2011

Related U.S. Application Data

(60) Provisional application No. 61/136,493, filed on Sep. 9, 2008.

(51) Int. Cl.
*G01B 11/14* (2006.01)
(52) U.S. Cl.
USPC ............................................ 356/622
(58) Field of Classification Search
USPC ................................. 356/614, 622
See application file for complete search history.

(56) References Cited

U.S. PATENT DOCUMENTS

| 4,896,217 A | 1/1990 | Miyazawa et al. |
| 5,315,123 A | 5/1994 | Itoh et al. |
| 5,559,601 A | 9/1996 | Gallatin et al. |
| 5,585,629 A * | 12/1996 | Doran et al. ............... 250/310 |

(Continued)

FOREIGN PATENT DOCUMENTS

DE    10242749 A1    4/2004

OTHER PUBLICATIONS

Supplemental European Search Report for EP Application No. 09813558.5 dated Mar. 29, 2012 (8 pages).
PCT International Search Report and Written Opinion of the International Searching Authority for PCT/US09/56400 dated Nov. 2, 2009 (10 pgs.).

(Continued)

*Primary Examiner* — Roy M Punnoose
(74) *Attorney, Agent, or Firm* — William Greener; Bond, Schoeneck & King, PLLC

(57) ABSTRACT

A wafer-scale nano-metrology system (10) for sensing position of a nanofabrication element (16) when illuminated by a patterned optical projection defining a grid or position measuring gauge includes a frequency stabilized laser emitter (12) configured to generate a laser emission at a selected frequency, where the laser emission forms a diverging beam configured to illuminate a selected area occupied by a target fabrication object (18) having a proximal surface. An optical pattern generator (14) is illuminated by laser (12) and generates a patterned optical projection grid or gauge for projection upon the target fabrication object (18). A movable tool or nanofabrication element (16) carries an optical sensor array (50), and the sensor array detect at least a portion of the optical projection grid, and, in response to that detection, generates grid position data for use in controlling the position of the tool (16).

17 Claims, 8 Drawing Sheets

U.S. PATENT DOCUMENTS

| | | | |
|---|---|---|---|
| 6,078,055 | A | 6/2000 | Bridger et al. |
| 6,425,669 | B1 | 7/2002 | Mei et al. |
| 7,289,212 | B2 | 10/2007 | Kwan |
| 2003/0047673 | A1 | 3/2003 | Thorburn et al. |
| 2003/0047674 | A1 | 3/2003 | Thornburn et al. |
| 2008/0037029 | A1 | 2/2008 | Nawata |

OTHER PUBLICATIONS

International Preliminary Report on Patentability Chapter I of the PCT dated Mar. 24, 2011 for International Application No. PCt/US09/56400 (9 pgs.).

* cited by examiner

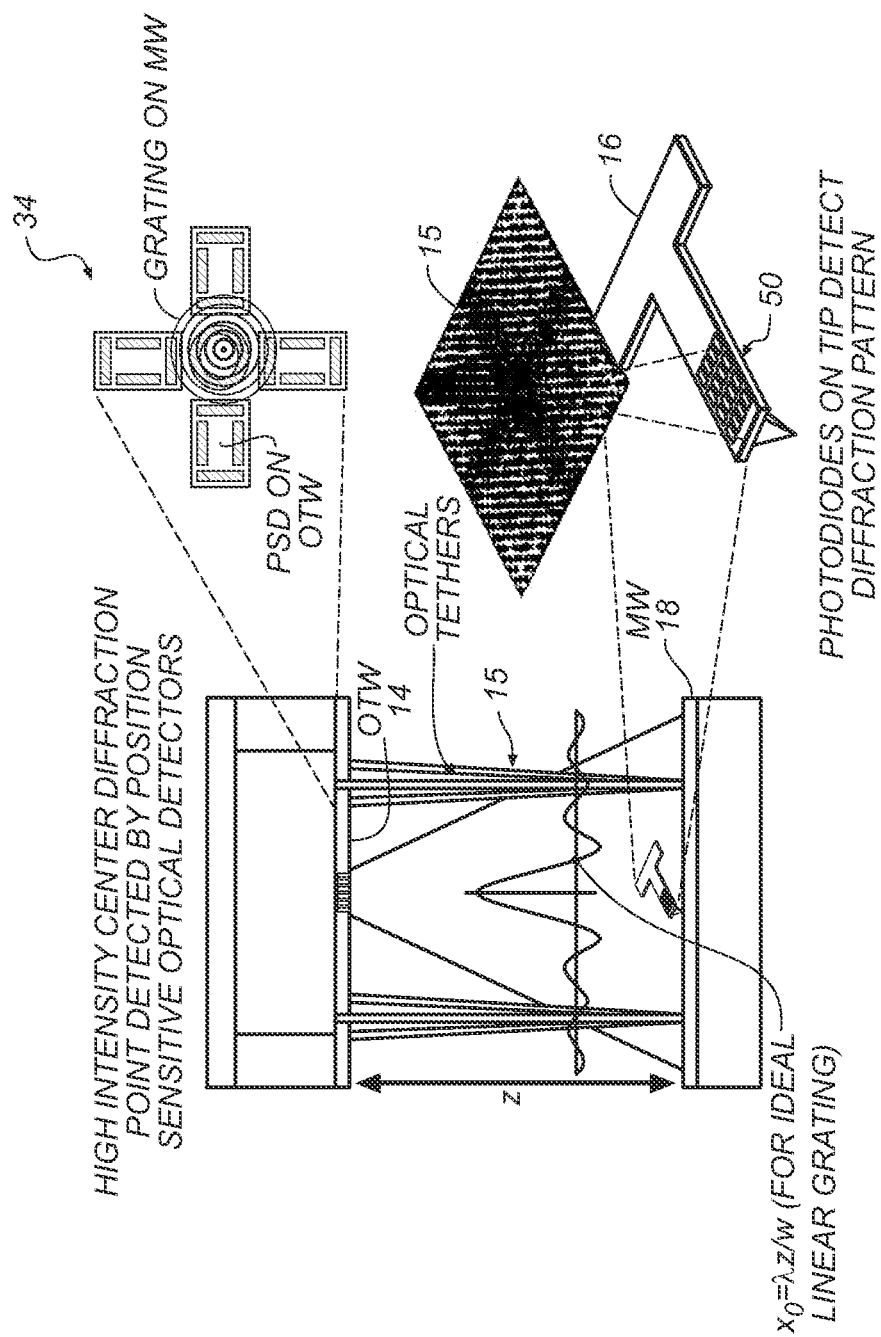

a)

a)

b)

b)

c)

c)

d)

d)

e)

e)

f)

f)

g)

h)

i)

OPTICAL GRID FOR HIGH PRECISION AND HIGH RESOLUTION METHOD OF WAFER-SCALE NANOFABRICATION

CROSS REFERENCE TO RELATED APPLICATIONS

This application is a national stage application under 35 U.S.C. §371 of PCT Application No. PCT/US2009/056400, filed Sep. 9, 2009, which claims the benefit of and priority to U.S. Provisional Patent Application No. 61/136,493 filed on Sep. 9, 2008, the entire disclosure of which is incorporated herein by reference.

BACKGROUND OF THE INVENTION

1. Field of the Invention

The present invention relates in general to nanofabrication and nanometrology methods and to high resolution systems for manufacturing and measuring very small structures in wafers and substrates.

2. Description of the Background Art

High Resolution nanofabrication on a manufacturing wafer is required when manufacturing integrated circuits (ICs) including millions of microscopic circuit elements on the surface of tiny chips of silicon taken from the wafer, which is typically made of Silicon or Polysilicon, and other semiconductor materials. These chips are used to make ICs such as computer processors, memory chips, and many other devices. Nanofabrication has also been used, more recently to manufacture a wide variety of released structures in wafers or substrates which are referred to as mechanical microstructures ("MEMS").

Wafers are traditionally coated with a reactive photoresist and then exposed to a selected pattern which can be defined in a mask or can be projected onto the wafer without a mask using a laser or electron beam. The photoresist is later etched or processed in a way that permits selective removal of exposed portions of the wafer. During exposure, the wafer or substrate is typically supported within a controlled-environment chamber upon a movable "stage."

For those systems that do not employ a mask, the precise placement and high resolution of features is determined by controlling the projected beam, and so typically, for very small beam deflections, deflection 'lenses' are used, while larger beam deflections require electromagnetic scanning. Because of the inaccuracy and because of the finite number of steps in the exposure grid the writing field is of the order of 100-1000 micrometer (~1 mm). Larger patterns have required stage moves, and so an accurate stage is critical for stitching (tiling writing fields exactly against each other) and pattern overlay (aligning a pattern to a previously made pattern).

The precision and speed of the nanofabrication process is therefore dependent in part, on the precision of the stage's placement, and the movable stage is made of expensive and precisely controlled structural elements and sensors. The stage must therefore have considerable mass, and the time taken to move that mass and then confirm or adjust the stage's position adds to the time needed for high resolution fabrication for any wafer having a large area.

Complex systems which integrate, for example, beam deflection control and stage movement control necessarily require considerable care in development and operation and those systems can be very expensive to configure and calibrate. Broadly speaking, the problem is determining the position of an object in 3D space with nanometer precision, which is stable over long periods of time. A particular physical example of this problem is that of placing scanning-probe, used in atomic surface microscopy [see e.g., G Binnig, H Rohrer, Ch Gerber, E Weibel, *Surface Studies by Scanning Tunneling Microscopy*, Phys Rev Lett 49, 57-61 (1982); G Binnig, C F Quate, Ch Gerber, *Atomic Force Microscope*, Phys Rev Lett 56, 930-933 (1966)] and tip-based micro- and nano-fabrication [A A Tseng, A Notargiacomo, T P Chen, *Nanofabrication by scanning probe microscope lithography: a review*, J Vac Sci Technol B 23, 877-894 (2005)] and tip-based nano- and micro-fabrication [A A Tseng, A Notargiacomo, T P Chen, *Nanofabrication by scanning probe microscope lithography: a review*, J Vac Sci Technol B 23, 877-894 (2005)] at locations with nanometer precision over a surface that is to be scanned. The probes or the surface being scanned are moved on a stage that is driven by a combination of motors including rotating electric motors and piezoelectric motors. These motors have considerable hysteresis and motion characteristics change due to aging of components and interfaces between components, both introducing sources of error in position control. The errors can be significant and if the probe is controlled to go back to a pre-defined starting position by following the motor's action in reverse, the probe can be off by distances too large compared to features that are of interest. Some typical examples of these features include quantum dots, nano-tubes and nano-scale transistors which have features in the 1-100 nm range. The aging and hysteresis errors affect the capability of the scanning probe to arrive at a given location and therefore when different samples are scanned, considerable time and effort is expended to find the location by scanning. This can be detrimental to scanning for defects in nano-manufacturing, increasing the time needed to achieve a high yield of nanoscale devices. In addition to scanning applications, the scanning probe technology can also be used to nano-fabricate or modify the surface under the probe by thermal [see e.g., P Vettiger, et al, *The "Millipede"—more than one thousand tips for parallel and dense AFM data storage*", APMRC 2000, Tokyo Japan, MC1-01-MC 1-02; W P King, et al, "*Atomic Force Microscope Cantilevers for Combined Thermomechanical Data Writing and Reading*", Appl Phys Lett 78, 1300-1302 (2001); R D Piner, J Zhu, F Xu, S Hong, C A Mirkin, "*Dip Pen Nanolithography*", Science 283, 661-663 (1999)] or electronic [R Nemutudi, N J Curson, N J Appleyard, D A Ritchie, G A C Jones, "*Modification of a shallow 2DEG by AFM lithography*", Microelectron. Eng. 967, 57-58 (2001)] effects. The need is usually to place nano-structures at precisely defined positions with precise distances between them, to realize predictable effects from device to device. For example, a typical task under tip-based nanofabrication (e.g., making pillars) using a probe is done by material deposition or removal under the probe. This requires the probe to be centered at the right x and y coordinates with nm accuracy. Furthermore, since the array placement accuracy might be needed over large distances (comparable to the size of wafers or die chips), getting very large arrays made with nm accuracy requires very high positioning accuracy. For example to achieve 1-nm accuracy over 1-cm requires a precision 1e-7 in placement. Such precision is not achievable in today's systems and therefore, time is laboriously spent searching for nanoscale features, limiting the throughput of nano-science and technology.

Current state-of-art in placement places the burden of probe location on the stage by incorporating optical interferometers across stage motion [see e.g., S Awtar, A H Slocum, "*Target Block Alignment Error in XY Stage Metrology*", Precision Engineering 31, 185-187 (2007)]. Such interferometers count fringes and distance between fringes by calibrating motion. The interferometers work along a narrow axis, so that a large reflective block surface spanning the orthogonal width of the stage is required. This makes the stages typically bulky, and initial starting point is still needed to move to an exact place. The bulky stages and fringe counting can limit the speed at which scanning can be done, and especially the frequency at which the stage can accelerate. Furthermore, during fringe counting, error in measurement systems associated with the signal-to-noise ratio of fringe counting and stage hysteresis within each fringe ultimately adds to the measurement offsets, leading to substantial errors when applied to motion over several mille-meters. The precision in the distance measurement also depends directly on the flatness of the large reflective block, which is difficult to manufacture to such high precision in the first place and suffers from drifts (due to effects of e.g. thermal, acoustics, etc), especially comparing one end of the block to the other. Other approaches to stage motion measurement include capacitive and strain sensors, however these sensors also age, are limited in travel range, and have limited precision because the precision in measurement is directly equivalent to the precision of actual manufactured device (here, a pair of capacitive plates) [see e.g., P W Kolb, R S Decca, H D Drew, "*Capacitive sensor for micropositioning in two dimensions*", Rev Sci Instrum 69, 310-312 (1998)].

In view of the foregoing, a need remains for an economical and reliable method and apparatus permitting high precision and high resolution wafer-scale nanofabrication.

SUMMARY OF THE INVENTION

The present invention addresses the foregoing need through provision of an economical and reliable method and apparatus permitting high precision and high resolution wafer-scale nano-metrology and nanofabrication.

In accordance with the present invention, an optical grid pattern is projected toward a surface by a laser source configured to generate a selected pattern by going through a diffractive or refractive element that is optionally made a part of the laser source, or be away at some distance away from the source.

The laser source's optical wavelength is locked to an external or internal atomic transition that provides stability to the wavelength providing a time-invariant or constant measure distance which is comparable to that found at the National Institute of Standards.

The optical grid pattern is received by an imaging sensor mounted to a tool or nanofabrication element that requires precise positioning, such as scanning probes. The sensed grid pattern is correlated to expected pattern to digitally find (or compute) the location of the imaging element with respect to the center point of the pattern generator.

The wafer-scale nano-metrology system senses the position of the tool or nanofabrication element when illuminated by the patterned optical projection that defines a grid or position measuring gauge. The system includes a frequency stabilized laser emitter configured to generate a laser emission at a selected frequency, where the laser emission forms a diverging beam configured to illuminate a selected area occupied by a target (e.g., a work piece or fabrication object) having a proximal surface. An optical pattern generator is illuminated by the laser emitter and generates the patterned optical projection grid or gauge for projection upon the target fabrication object. The movable tool or nanofabrication element carries an optical sensor array, and the sensor array is configured to detect at least a portion of the optical projection grid, and, in response to that detection, generates grid position data for use in controlling the position of the tool.

BRIEF DESCRIPTION OF THE DRAWINGS

The features and advantages of the present invention will become apparent from the following detailed description of a number of preferred embodiments thereof, taken in conjunction with the accompanying drawings, in which:

FIG. 6B is another diagram illustrating the orientation of the patterned laser projection or grid as related to components for the frequency stabilized laser in the nano-optical ruler imaging system of FIGS. 1-5, in accordance with the present invention.

DETAILED DESCRIPTION OF THE PREFERRED EMBODIMENTS

Figure 1:
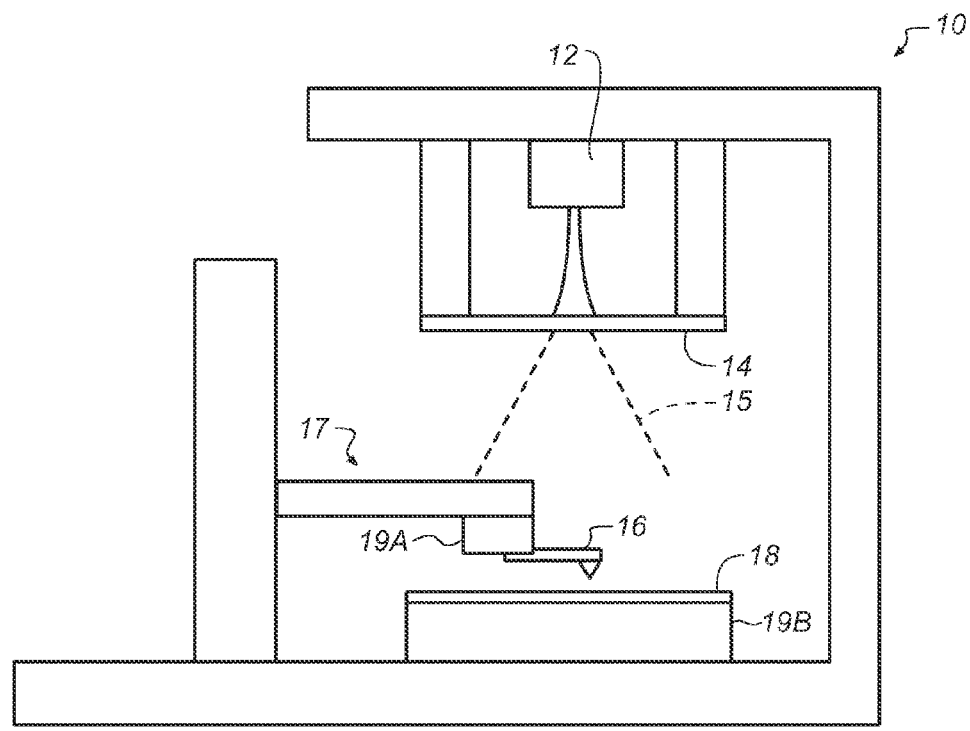
FIG. 1 is a schematic diagram illustrating the orientation of the components for a nano-optical ruler imaging system, in accordance with a first embodiment of the present invention.

With reference to FIGS. 1-6B, an early prototype nano-optical ruler imaging system 10 includes a frequency stabilized laser 12 configured to aim a laser beam downwardly through an optical tether wafer (or "OTW") 14 to project a high precision optical ruler 15 in space, which impinges upon a nano fabrication element (e.g., such as scanning probe 16 and a manufacturing wafer 18).

Scanning probe 16 is carried by any stable, movable, and controllable mechanism 17 that can movably position scanning probe 16 in any position needed to effectuate a fabrication process step anywhere on the upper or proximal surface of manufacturing wafer 18. In a preferred embodiment controllable mechanism 17, including a fine resolution X-Y-Z (3 axis) controller 19A and a coarse X-Y (2 axis) stage controller 19B are each configured to respond to control signals used to change the position of tool or nano fabrication element relative to the upper or proximal surface of manufacturing wafer 18.

Figure 2:
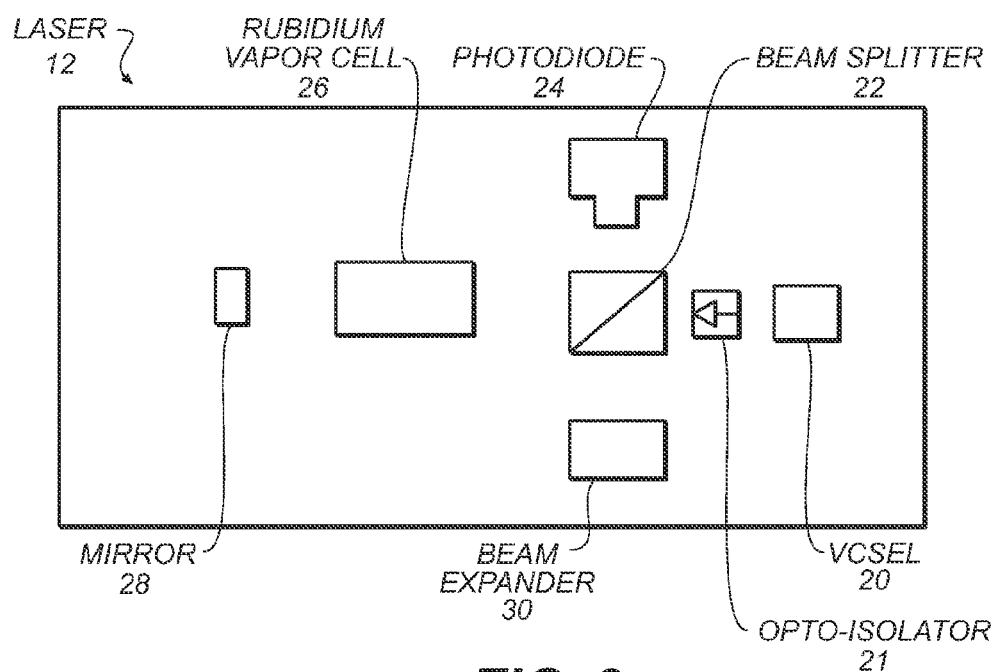
FIG. 2 is a diagram illustrating the components for the frequency stabilized laser in the nano-optical ruler imaging system of FIG. 1, in accordance with the present invention.

As illustrated in FIGS. 1 and 2, frequency stabilized laser 12 includes a semiconductor laser 20 which is locked to an atomic frequency by saturation spectroscopy (e.g., as enabled by use of Rubidium vapor cell 26). A frequency stabilized He—Ne laser can also be used. Frequency stabilized laser 12 also includes beam splitter 22, photodiode 24, mirror 28, opti-isolator 21 and beam expander 30, for expanding laser emission before projection toward the optical tether wafer 14.

Figure 3A:
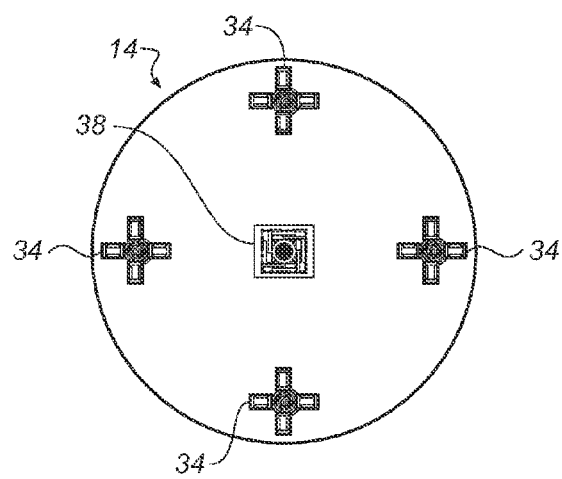
FIGS. 3A-3C are diagrams illustrating the components and properties for the Optical Tether Wafer (OTW) in the nano-optical ruler imaging system of FIG. 1, in accordance with the present invention.
Figure 3B:
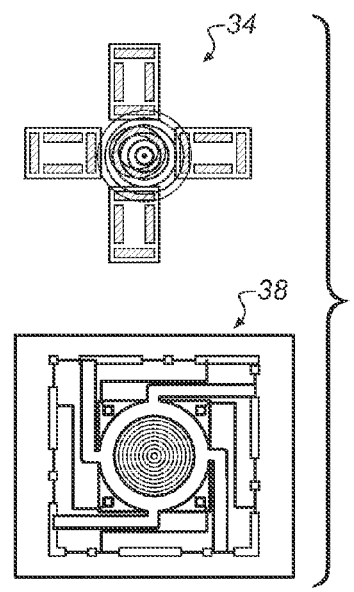
Figure 3C:
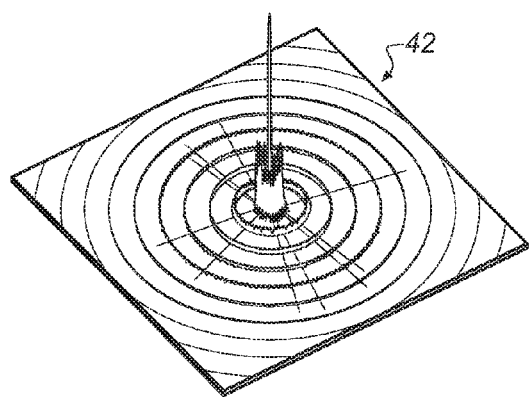

FIGS. 3A-3C illustrate the optical tether wafer (or "OTW") 14, consisting of two main parts. First, an array of four evenly spaced radially arrayed position sensitive optical detectors 34 are, in the illustrated embodiment, positioned proximate the outer peripheral edge on an upper surface of OTW 14. In use, manufacturing wafer ("MW") 18 will reflect some of the diffraction pattern and an optical signal will be reflected back to OTW 14. Depending on the distance and angle between the OTW and MW, the optical signals will be off-center on the position sensitive detectors 34. By properly adjusting the location and angle of OTW 14, the reflected optical signals on all four position sensitive detectors 34 will be centered.

Second, a diffraction aperture 38 or temperature stabilized optical grating is fabricated into the center of the OTW 14. The laser beam 15 passes through the diffraction aperture 38 to form the diffraction pattern (e.g., 42, as shown in FIG. 3C. A quasiperiodic grating (for example, a Penrose tiling vertices pattern) is used to generate a translationally invariant diffraction pattern optical ruler (see, e.g., FIG. 6). The diffraction element can have features much greater than the optical wavelength, in which case the created pattern does not have diffractive features providing shadow image of the pattern. However, in the preferred embodiment the diffractive element has dimensions comparable to the optical wavelength which leads to generation of diffractive pattern consisting of phase interference between optical electrical fields emitted from edges of the pattern. Such a diffractive pattern can result in optical intensity pattern that has spatial higher frequency variations, and allows for higher resolution in probe location. The element that creates the pattern can also be refractive, in which case the initial beam is interfered with itself by refractive effects. The element can also be a combination of diffractive and refractive elements to generate complex optical patterns. Alternatively, the optical source might not be coherent, but an incoherent lamp that predominantly generates one wavelength. However, in this case the lack of phase may lead to less feature-rich optical patterns.

Figure 4:
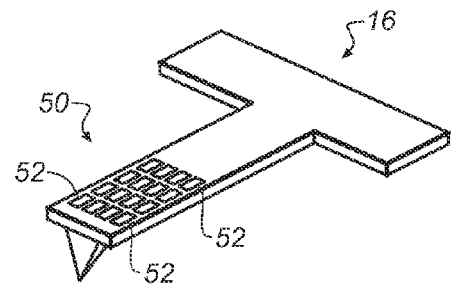
FIG. 4 is a diagram illustrating the components for the scanning probe Nano fabrication element in the nano-optical ruler imaging system of FIG. 1, in accordance with the present invention.

FIG. 4 illustrates how a nanofabrication device (e.g., scanning probe 16) may be designed to measure the optical grid. As best seen in FIG. 4, the top side of the probe is fabricated with an array 50 of photodetectors 52. The photodetectors take an image of the projected optical ruler, then compare the image to an image of the optical ruler with a known position. The position offset of the two images is calculated by sub-pixel image registration techniques (e.g., fast Fourier transform cross correlation), thereby calculating the position of the probe. The calculation optionally gives scanning probe position in all three spatial dimensions. Because a quasiperiodic diffraction aperture 38 is used, the optical ruler is translationally invariant. The calculated positions are spatially unique, meaning that no two images of different positions will yield the same calculated position; this is in contrast to interferometric schemes which calculate positions that repeat periodically with the wavelength of light used. The image of FIG. 6 shows an exemplary patterned laser projection or optical ruler.

Figure 5:
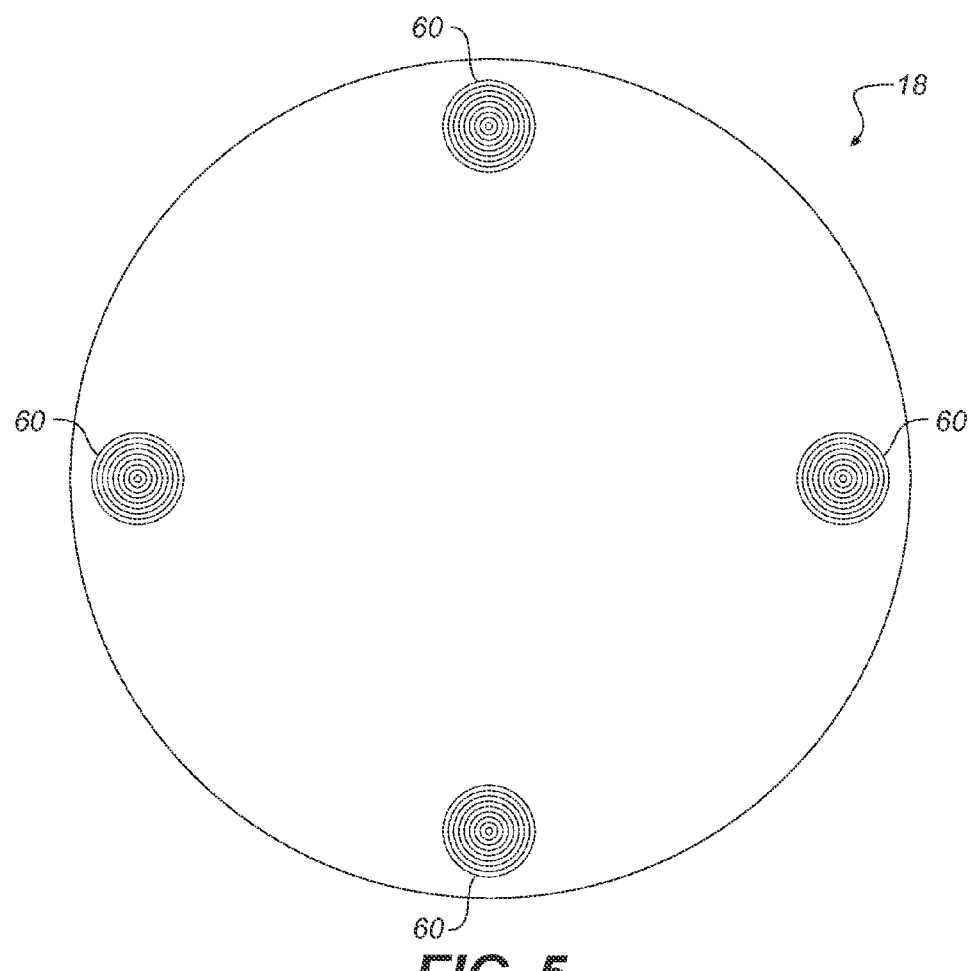
FIG. 5 is a diagram illustrating the components for an exemplary Manufacturing Wafer ("MW") in the nano-optical ruler imaging system of FIG. 1, in accordance with the present invention.

FIG. 5 shows an exemplary MW 18. Diffraction gratings 60 can be fabricated on an upper surface of wafer 18 to create the optical signal back to OTW 14 for alignment. However, direct reflections from a typically smooth MW surface can also be used, whereby no special MW is required.

Nano-optical ruler imaging system 10 enables precise and high resolution nanofabrication on manufacturing wafer 18 by projecting an optical grid that provides an accurate spatial ruler over a large area. The prior art method, as noted above, is to move the stage and manufacturing wafer, but this limits the speed of fabrication due to the large mass of the stage. In the illustrated embodiment of the system of the present invention, a nanofabricating device such as a scanning probe 16 is moved and accelerated much more quickly and accurately in reference to the optical grid. In accordance with the present invention, there are no errors arising from stage movement when driven by piezoelectric stages which suffer from hysteresis and creeping.

Nano-optical ruler imaging system 10 provides a means for continuous position verification, effectively eliminating errors arising from such effects. Both the MW 18 and the nanofabricating device 16 are aligned with respect to the OTW 14, resulting in alignment to each other. FIG. 1 illustrates the components. Laser optics 12 generates a highly stable laser beam that is used to illuminate the diffraction pattern. Optical tether wafer (OTW) 14 is fabricated with the diffraction aperture and optics elements for aligning the manufacturing wafer 18 to the OTW 14. The OTW 14 is preferably mounted on piezoelectric elements, so that the tilt and three-dimensional position of the OTW 14 can be precisely adjusted. Nanofabrication element 16 represents a generic nanofabrication device which fabricates by moving around and on the manufacturing wafer 18, and is guided by the optical grid formed by laser 12 when projecting a laser beam through OTW 14. In the illustrated example, nanofabrication element 16 is shown to be a scanning probe tip. The manufacturing wafer (MW) 18 is the wafer to be manufactured with the nanofabrication system 10.

Figure 6A:
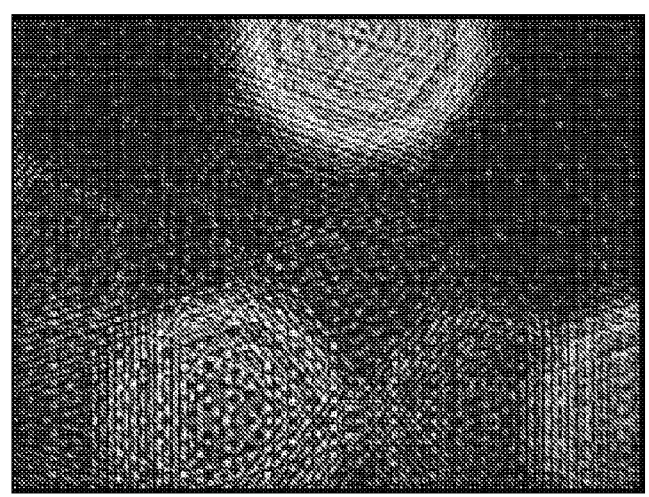
FIG. 6A is a cross correlation image generated by a prototype scanning probe imager components for the nano-optical ruler imaging system of FIGS. 1, 4 and 6B, in accordance with the present invention.
Figure 7:
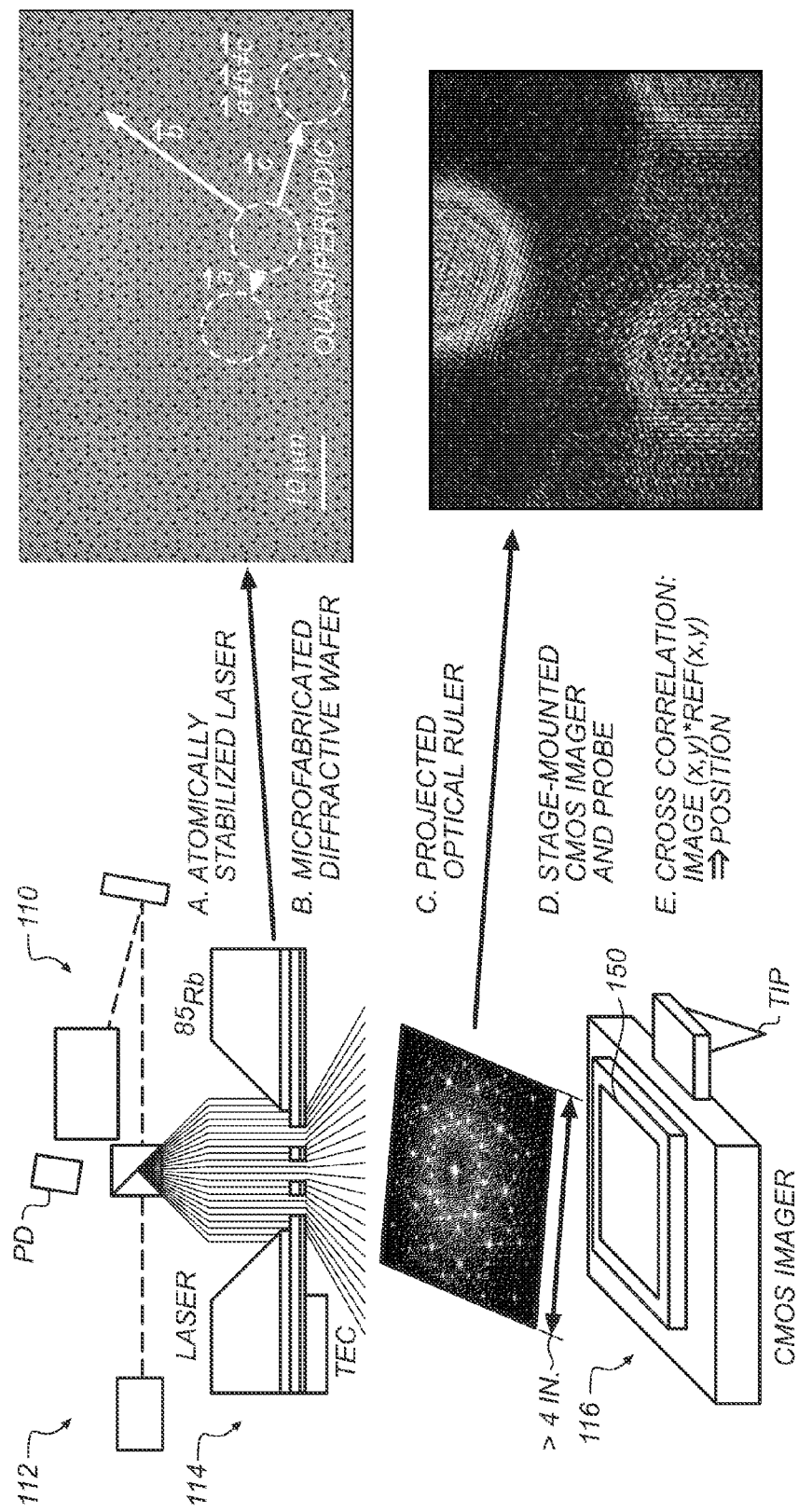
FIGS. 7A-7E illustrate components and features of a nano-optical ruler imaging system (NORIS), in accordance with the present invention. a. An external cavity laser is frequency stabilized to a saturated resonance, (F=2 to 1) of the D2-line of $^{85}$Rb. It is stabilized to within 6 MHz, or a relative accuracy of $1.5 \times 10^{-8}$. b. A thermally stabilized microfabricated Penrose vertices grating diffracts the laser beam (fabricated using ebeam lithography on SOI device layer; device layer Si etch; thru carrier wafer backside KOH etch; buffered HF release; Cr/Au evaporation). The grating is temperature stabilized at 22.77±0.03° C. using a feedback-controlled thermoelectric cooler. c. Wafer-scale optical ruler is shown, and CMOS camera acquired image of a small section of the optical ruler. There is no translational symmetry within whole image size, indicating that calculated positions are unique: this is a general property of the optical ruler. d. Tip/CMOS imager is mounted on a commercial stage. e. Cross correlation calculates the CMOS imager position within the optical ruler within 50 nm. The Fabry-Perot cavity formed between the diffractive wafer and CMOS imager mount is used for height positioning of the probe (not shown).

FIG. 6A illustrates a two dimensional depiction of a planar surface (e.g., the upper or proximal surface of wafer 18) when illuminated by a patterned optical projection 15.

Turning now to FIGS. 7A-11, a later embodiment nano-optical ruler imaging system 110 includes a frequency stabilized laser 112 configured to project a laser beam downwardly through an optical tether wafer 114 to impinge upon a nano fabrication element (e.g., such as scanning probe 116 and a manufacturing wafer 118). Scanning probe 116 is carried by any stable, movable, controllable mechanism 117 (e.g., a FAST XYZ stage which controls an arm carrying a nanomotion xyz tip controller to move the fabricator tip) that can movably position scanning probe 116 in any position needed to effectuate a fabrication process step anywhere on the upper surface of manufacturing wafer 118. All of these components are preferably mounted within a rigid frame 119.

As best seen in FIGS. 7A-7E, a later prototype of nano-optical ruler imaging system 110 ("NORIS") includes an external cavity laser 112 which is preferably frequency stabilized to a saturated resonance (F=2 to 1) of the D2-line of $^{85}$Rb, and is stabilized to within 6 MHz, or a relative accuracy of $1.5\times10^{-8}$. A frequency stabilized HeNe laser, or similar frequency stabilized laser, can be used. Referring now to FIG. 7B, a thermally stabilized microfabricated Penrose vertices grating, or other quasiperiodic grating, diffracts the laser beam and is fabricated using nano lithography (e.g. using e-beam lithography) on an SOI device layer (e.g., fabricated as follows: device layer Si etch; thru carrier wafer backside KOH etch; buffered HF release; Cr/Au evaporation). The grating is temperature stabilized at 22.77±0.03° C. using a feedback-controlled thermoelectric cooler. Turning now to FIG. 7C, a wafer-scale patterned laser projection or optical ruler is shown, and a CMOS camera acquired image of a small section of the optical ruler is illustrated. There is no translational symmetry within whole image size, indicating that calculated positions are unique: this is a general desired property of the optical ruler, in accordance with the present invention. Turning now to FIG. 7D, a Tip/CMOS imager is mounted on a commercial stage. As best seen in FIG. 7E, Cross correlation calculates the CMOS imager position within patterned laser projection or optical ruler, and that calculation is accurate to within 50 nm. A Fabry-Perot cavity formed between the diffractive wafer 114 and CMOS imager mount is used for height positioning of the probe 116 (not shown). By engineering design of system parameters such as the distance between the manufacturing wafer 118 and optical transfer wafer 114, the size and pattern of the diffraction grating, the wavelength or use of multiple wavelengths of the frequency stabilized laser 112, etc., the precision and optical ruler size can be changed and balanced.

The NORI system 110 of the present invention solves the problems of prior art systems by providing an atomically-stabilized, long-term stable, wafer-scale patterned laser projection or optical gauge or ruler which provides a nanometrology system, potentially achieving sub-10-nm precision over a four inch wafer and demonstrating a relative precision of $1\times10^{-7}$. The Nano-Optical Ruler Imaging System (NORIS) 110 enables fast, precise, repeatable, path-independent, spatially unique, stage-independent, wafer-scale nanometer positioning of probes (e.g., scanning probes 16 or 116 or other fabrication elements) with an integrated imaging camera. NORI system 110 consists of an atomically stabilized laser 112 as the starting point. A laser wavelength is stabilized across an atomic transition such as that of rubidium atoms. A vapor of rubidium atoms is placed in the path of a laser which is tuned to coincide to one of the rubidium absorption lines, resulting in a wavelength stability of $1\times10^{-8}$. This accuracy is stable over very long times as the atomic structure does not age at all. The wavelength is therefore an accurate and stable distance constant of nature. Just as atomic clocks use alkali atoms to stabilize a frequency source over long times, here the alkali atoms stabilize an optical source for a long-term stabilized wavelength-determined optical gauge or ruler. The laser can also be used without atomic stabilization, but would lead to accuracies in $1\times10^{-3}$ to $1\times10^{-5}$ range, due to drifts in laser wavelengths associated with changes in parameters effecting laser frequency. These include temperature, laser cavity length, laser material aging, etc.

The system's output laser light is then aimed at and incident upon a stabilized laser projector that diffracts or refracts the laser beam into a pattern that is projected onto a surface. The example of this illustrated in FIGS. 7A-7E is a thermally stabilized microfabricated quasiperiodic grating that diffracts a long-term stable nanoruler pattern. The grating needs to be thermally stable so as to minimize the effects of thermal expansion on the grating dimensions and material properties. By using integrated resistive temperature sensors, heaters and/or coolers, one can stabilize the grating to 0.01 C, thereby limiting dimensional changes due to temperature to $1\times10^7$ (as typical coefficients of thermal expansion are in the 1-10 ppm/C range). The combination of the atomically stabilized laser 112 and the grating therefore can result in 1e-7 long-term stable optical pattern.

By imaging the optical gauge or ruler with scanning probe 116 with an integrated optical sensor or imager 150, one can correlate the image acquired with the projected expected image to determine the position of the imager 150 to nanometer scale. The exemplary CMOS imaging integrated chip 150 has a substantially planar, square two dimensional array of 1000×1000 pixels and so can correlate the collected image at sensor chip 150 to the projected image or ruler to determine the location of the imager center point to nm scale. Each pixel of the imaging chips provides a degree of freedom in an interpolation expansion that can be compared to the projected image to quickly determine the position of scanning probe 116. Since the projected image is sampled with many pixels in sensor 150, the resolution in position determination can be much smaller than the pixel size. Typical pixel sizes are in the 3-5 micron range, but by using interpolation over 100 s to 1000 s of pixels, resolution in the range of nanometers is possible. The z-position and tilt of the probe can also be determined by calculating the shape offset from the acquired image due to tilt and expansion of the projected pattern or ruler at different z-positions.

FIGS. 7A-7E and FIG. 11 schematically illustrate the NORI system 110 of the present invention. The external-cavity's laser wavelength is stabilized to a relative accuracy of $1.5\times10^{-8}$, and the beam diffracts from microfabricated the OTWs grating which is preferably made from $SiO_2$/Cr/Au. A periodic grating would generates a translationally symmetric diffraction pattern lacking unique position information, as in interferometric systems, and so the applicants instead configured a quasiperiodic Penrose tile vertices pattern grating which projects or generates a spatially unique set of dense spots in three dimensional space, thereby providing a precise optical gauge or nanoruler providing absolute position information.

To calculate a position for the nanofabricating element 116, a sample image is taken of the projected optical ruler with optical sensor 150 (which can be, e.g., a probe-integrated 8-bit, 3.6 μm pixel 640×480 CMOS imager). The image data is input to a computer or processor (not shown) which is programmed such that this sample image's data is Fourier transform cross-correlated ("FTCC") [see e.g., M Guizar-Sicairos, S T Thurman, J R Fienup, "*Efficient Subpixel Image Registration Algorithms*", Opt Lett 33, 156-158 (2008)] with sub-pixel resolution to data for a reference image of the projected optical ruler at a known position for the nanofabricating element 116. The computer (not shown) is programmed with an FTCC program which calculates a displacement of the current position from the reference image position (i.e., image registration). An 8-bit imager has a $4 \times 10^{-3}$ quantization error but by using multiple images at different exposure settings, the pixel analogue-to-digital converters sample the optical intensities at more levels and so, for the exemplary prototype, effectively image at 14.6 pixels, or a quantization error of $4 \times 10^{-5}$. Increased precision and estimation of position errors, caused by FTCC- or imaging noise, are derived by calculating positions using reference images of several known positions for the nanofabricating element 116.

Figure 10A:
FIG. 10A illustrates, in sequence diagrams a-f, the process flow for making a diffraction grating, in accordance with the present invention.
Figure 10A:
Figure 10A:
Figure 10A:
Figure 10A:
Figure 10A:
Figure 10A:
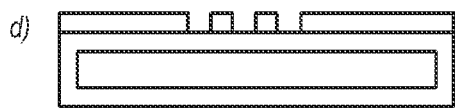
Figure 10A:
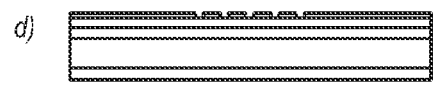
Figure 10A:
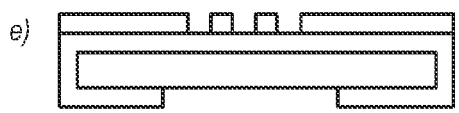
Figure 10A:
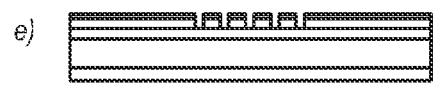
Figure 10A:
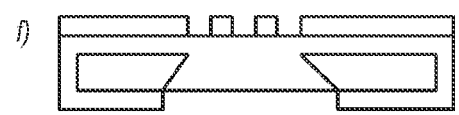
Figure 10A:
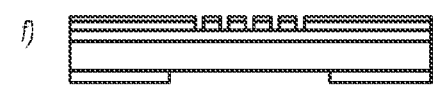

Turning now to FIG. 10A, with diagrams a-f, a process flow and stages for fabricating a diffraction grating are shown in FIG. 10A diagrams a-f. The projector chip or OTW (e.g., 14 or 114) and its grating are preferably fabricated by depositing LPCVD low stress nitride on a bare Si wafer (a and b), followed by 400 nm of e-beam evaporated Al (c). The Al is patterned (d) in a chlorine RIE. After patterning a window (1×1 mm$^2$) into the backside nitride (e), and then a backside KOH through-etch (f) exposes the thin film through the bulk Si. The Al thin film is patterned with different patterns, for example a hexagonal lattice aperture grid with 10 μm separation between the 3 μm square holes. The resulting diffraction pattern is a hexagonal lattice of high intensity maxima, with separations of 9.3 mm at the MW (e.g., 18 or 118). The large separation accommodates the large area (15 mm per side) quadrature photodetector.

Figure 10B:
FIG. 10B illustrates, in sequence diagrams a-i, a second process flow for making a diffraction grating, in accordance with the present invention.
Figure 10B:
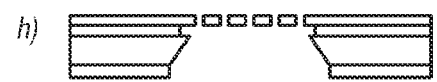
Figure 10B:
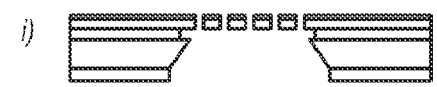

Turning next to FIG. 10B, and process flow step diagrams a-I, a silicon-on-insulator wafer process flow is shown. The first step (a) includes a low pressure chemical vapor deposition of low stress nitride (300 nm); (b) the frontside nitride is removed in a fluorine chemistry etch. Thermal oxidation of Si (c) yields 200 nm on the device layer. The thermal oxidation silicon mask is patterned (d) by electron beam lithography. Chlorine chemistry etches the device layer silicon(e), and backside etching (f) opens a window in the nitride. KOH through-wafer etch of the handle wafer (g) opens access through the back side, and hydrofluoric acid etch of oxide (h) removes silicon oxide from the diffraction grating. Chrome/gold is electron beam evaporated (i) as the reflective thin film. Though a different process, the same diffraction gratings can be fabricated in either process flow.

Figure 11:
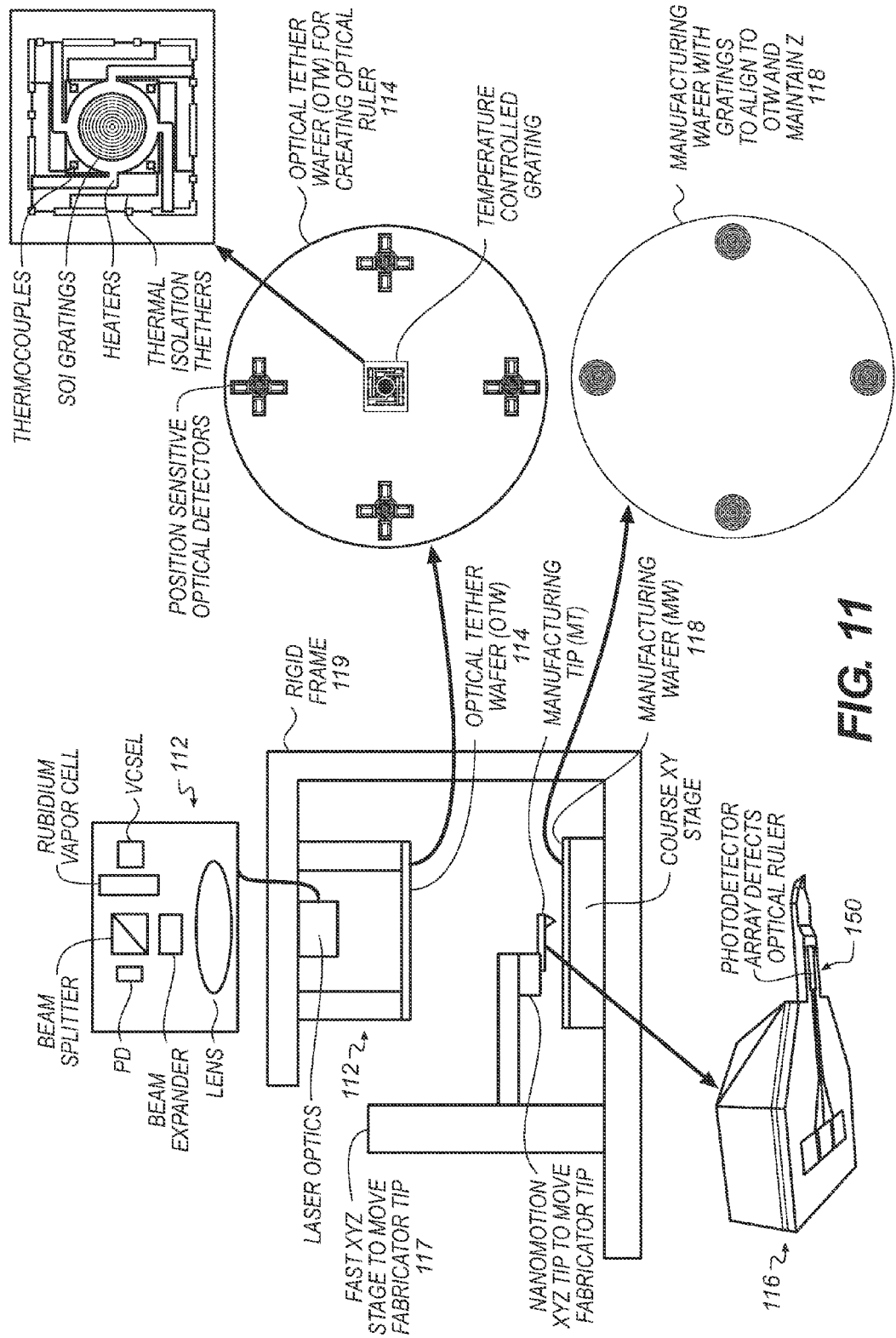
FIG. 11 is a multi-part diagram illustrating the configuration and orientation of components of the nano-optical ruler imaging system, in accordance with the present invention.

In FIG. 11, optical sensor 150 is shown on the bottom of the tip mount. Shadowing is not a problem, even where the base of the tip will be in line with the grating, so long as the probe is substantially transparent or if a mirror is positioned to reflect the patterned laser or optical projection. In recent prototypes, imaging sensor 150 is on top of the nanofabrication element and so is directly illuminated by the patterned laser or optical projection.

Figure 8A:
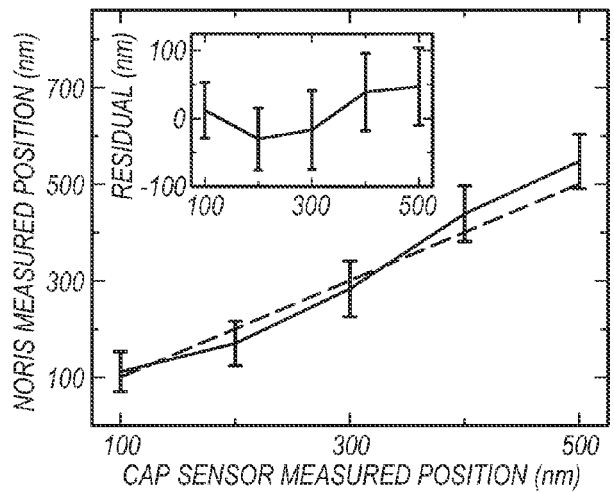
FIGS. 8A-8B. illustrate position performance measurements of the nano-optical ruler imaging system, in accordance with the present invention.
Figure 8B:
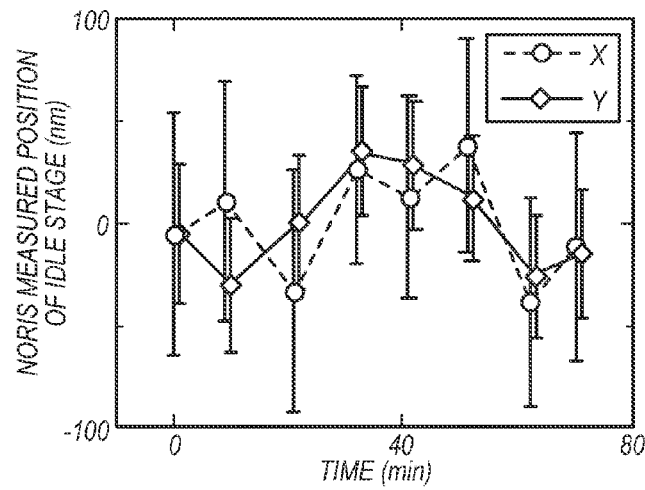

Turning now to FIGS. 8A-9B, it is shown that measured performance for NORI system 110 is promising. FIG. 8a shows the high precision of NORI system's measurement compared to those of the capacitive sensors of a commercial piezoelectric stage (i.e., nPoint XYZ100B, a high precision capacitive sensor stage) and shows sub-50 nm precision of NORI system 110 (i.e., $5 \times 10^{-7}$ over four inch wafer118). FIG. 8b shows the long term stability of NORIS over 1.5 hours (illustrating that less than 38 nm of deviation was observed for the nanofabricating element 116 (measurement of NORIS in x and y directions of an idle stage). It was noted that the correlated drift was possibly due to mechanical stress from cable connectors to the CMOS imager 150.

Figure 9A:
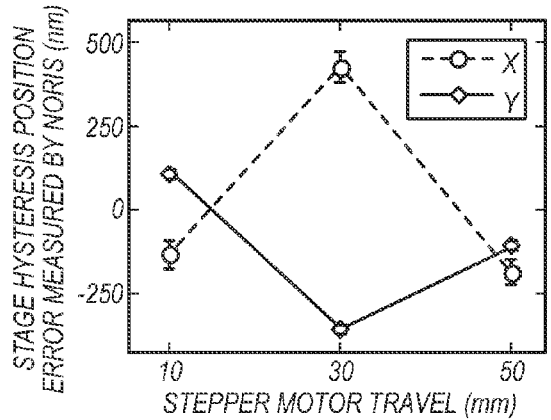
FIGS. 9A-9B. illustrate hysteresis and position error measurements using the nano-optical ruler imaging system, in accordance with the present invention.
Figure 9B:
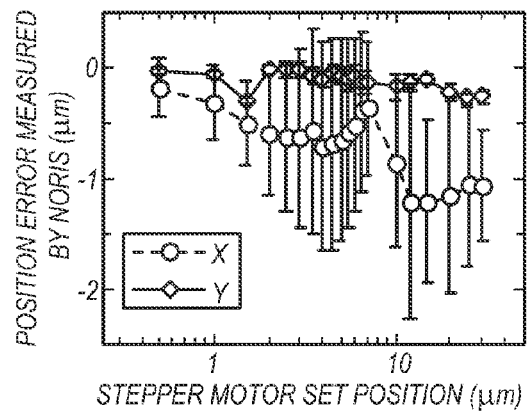

FIG. 9a shows the hysteresis position error after the stepper motor is moved along randomly chosen, relatively long distances (greater than 10 mm), and then returned to the starting position. Specifically, illustrated are hysteresis of stepper stage after 10, 30, and 50 mm travel and return, as measured by NORIS 110. FIG. 9b shows NORI system measured position errors of the stepper motor as it traverses 30 μm. The position error was measured by NORIS 110 as the stepper stage moved 30 μm. It was noted that unique positions are calculated even over long travel, a measuring result that is not possible when relying on interferometric metrology systems.

Practitioners in this art of nanofabrication and nanometrology have recognized that drift of the stage (e.g., holding MW 118) relative to probe 116 is problematic. There is drift due to the stage motion, due to probe motion, vibration, thermal expansion, position sensor aging, etc. NORI system 110, due to the long term stability of the alkali-vapor locked laser (e.g., 12 or 112) provides a source for a long term stable patterned laser projection, gauge or ruler to which the stage and/or the probe can be controlled and locked to by optical detection (e.g., with photodetector array 50 or optical sensor 150).

In more general terms the optical metrology system of the present invention can provide a stable reference for positioning a controlled instrument or object on virtually any scale, from nm to mm to meters. The system of the present invention provides a single patterned laser projection, or, in multi projector embodiments, overlapping ruler or gauge projections from a plurality of lasers, for use in two and three measurement, positioning and guiding.

The degree of stabilization of the optical projection that is required is a function of the degree of precision required. Whereas NM precision most likely requires sub nanometer stability, MM precession might only require sub mm stability. If someone only wants cm precision, no stabilization may be necessary, even over large distances. It is believed that if the properties of the laser 12 and OTW grating are sufficiently well characterized and their initial state is measured with enough precision, any changes to the projected pattern or grid can be accounted for or corrected computationally. Thus, for less-demanding applications, it is not necessary to stabilize either the laser or the grating to achieve nm accuracy; corrective factors or adjustments can be computed on the fly. It may be preferable to stabilize the laser and OTW grating (e.g., it may prove cheaper or easier or better), but stabilization, for some applications, may not be required. Also, having multiple imaging sensors on multiple probes under the projected pattern would allow precise location of each probe with respect to each other.

In another embodiment, system 10 is changed to provide temporal modulation of the projector pattern from OTW 14 at a selected pattern modulation frequency, such that same modulation appears in the imaged pattern projected upon MW 18. This technique would allow one to increase the signal to noise ratio of measuring the optical field by heterodyning.

It will be appreciated by practitioners of this art that the present invention comprises a new approach to metrology, especially when engaged in wafer-scale nanofabrication operations.

Broadly speaking, the method of the present invention includes the following steps: (a) generating an optical emission (e.g., from laser emission source 12 or 112); (b) providing an optical pattern generator (e.g., 14 or 114), and illuminating the optical pattern generator with the optical emission; (c) providing an optical sensor array (e.g., 50 or 150); (d) projecting a patterned optical projection (e.g., 15) upon optical sensor array; (e) providing a fabrication element (e.g., a tool or instrument such as scanning probe 16) and a fabrication mount to which a target fabrication object can be secured, where the fabrication element and the fabrication mount can move relative to one another, and where the position of the patterned optical projection relative to one and the position of the optical sensor array relative to the other is known; (f) detecting at least a portion of the patterned optical projection when projected upon the optical sensor array, and, in response to that pattern detection, generating a sample's projection pattern position data; and (g) providing a computing device configured to receive that sample's projection pattern position data; and (h) cross correlating the patterned optical projection and that sample's projection pattern position data to determine a location for the fabrication element relative to the fabrication mount and to any target fabrication object secured thereto.

The NORI system (e.g., 10 or 110) is readily programmed to permit a continuous sequence of sensing, calculating moving, sensing, calculating moving steps using successive samples of projection pattern position data to continuously control a moving fabrication element, for controlled movement relative to any target fabrication object or surface when illuminated with the patterned optical projection 15.

In FIG. 11, nano-optical ruler imaging system 110 includes a frequency stabilized laser 112 configured to project a laser emission downwardly through an optical tether wafer 114 to impinge upon a nano-fabrication element (e.g., such as scanning probe 116 and a manufacturing wafer 118). Scanning probe 116 is mounted upon a stable, movable, controllable mechanism 117 including a nanomotion XYZ tip controller to move the fabricator tip (e.g., a FAST XYZ stage which controls an arm carrying a nanomotion xyz tip controller to move the fabricator tip) that can movably position scanning probe 116 in any position needed to effectuate a fabrication process step anywhere on the upper surface of manufacturing wafer 118. Preferably, wafer 118 is releasably affixed to a movable stage which is controllable in two axes, (XY), such that large, course movements are available using the stage and finer movements are available using the nanomotion tip control. All of these components are preferably mounted within a rigid frame 119.

The NORI system (e.g., 10) can be retrofitted in existing scanning probe systems, by adding a mechanical cantilever rigidly attached to the existing stage. The cantilever would have an integrated imager that would find its position using the patterned laser projection (e.g., 15). The projection's optical grid is designed such that the maximum motion of the stage is covered under or within the outer reaches of the projected optical grid. The NORI system projector in this case would then be rigidly attached to the frame (e.g., 119) of the system. Alternatively, the projector can be on the moving stage and the imager element can be on the system. In the case of retrofitting existing stages, the existing control system would need to incorporate an interface to the NORI system for position correction. A considerable design space exists retrofitting existing nanomotion stages by appropriate placement of imager and nano optical grid projector hardware.

Although the invention has been disclosed in terms of a number of preferred embodiment and numerous variations thereon, it will be understood that numerous additional modifications and variations could be made thereto without departing from the scope of the invention as defined in the following claims

What is claimed is:

1. A wafer-scale nanometrology system for sensing position of a nanofabrication element when illuminated by a patterned optical projection defining a grid or position measuring gauge, comprising:

(a) a frequency stabilized laser emitter configured to generate a laser emission at a selected frequency, wherein said laser emission forms a diverging beam configured to illuminate a selected area occupied by a target fabrication object having a proximal surface;

(b) an optical pattern generator configured to be illuminated by said laser emission and generate a patterned optical projection grid for projection upon the target fabrication object's proximal surface;

(c) a movable nanofabrication element carrying an optical sensor array on a selected surface, said sensor array being configured to detect at least a portion of said patterned optical projection grid, and, in response to said detection, is configured to generate projection grid position data; and (d) a computing device configured to receive said projection grid position data and programmed to correlate said patterned optical projection grid and said projection grid position data to determine a location for said nanofabrication element relative to said fabrication object's proximal surface.

2. The wafer-scale nanometrology system of claim 1, further comprising: a stage or support configured to receive a target fabrication object in the form of a substantially planar semiconductor manufacturing wafer.

3. The wafer-scale nanometrology system of claim 1, wherein said optical pattern generator comprises a diffraction grating defined in an optically transmissive wafer.

4. The wafer-scale nanometrology system of claim 1, wherein said movable nanofabrication element carrying an optical sensor array on a selected surface comprises a scanning probe carrying a photodetector array.

5. The wafer-scale nanometrology system of claim 1, wherein said movable nanofabrication element carrying an optical sensor array on a selected surface comprises a scanning probe carrying a CMOS imager with a two dimensional array of pixels.

6. The wafer-scale nanometrology system of claim 1, wherein said frequency stabilized laser emitter comprises a surface emitting laser, a beam splitter and a beam expander.

7. The wafer-scale nanometrology system of claim 6, wherein said frequency stabilized laser emitter further comprises a an atom vapor cell configured such that the surface emitting laser locks to an absorption line of atom vapor such as that of rubidium or cesium.

8. The wafer-scale nanometrology system of claim 1, wherein said optical pattern generator comprises a diffraction grating defined in an optically transmissive wafer as an optical grid pattern which generates a precise patterned optical projection between said optical pattern generator and said target fabrication object's proximal surface, to provide a precise optical gauge which provides absolute three dimensional position information for said nanofabrication element.

9. The wafer-scale nanometrology system of claim 8, wherein said optical pattern generator comprises a diffraction grating defined in an optically transmissive wafer as a Penrose tile vertices or otherwise quasiperiodic pattern which generates a spatially unique set of dense spots in space, and thereby generates a precise patterned optical projection between said optical pattern generator and said target fabrication object's proximal surface, to provide a precise optical gauge which provides absolute three dimensional position information for said nanofabrication element.

10. A method for sensing position of a nanofabrication element, comprising:

(a) generating a diverging laser emission at a selected frequency, wherein said laser emission forms a diverging beam;
(b) illuminating a selected area occupied by a target fabrication object having a proximal surface;
(c) providing an optical pattern generator, and illuminating said optical pattern generator with said laser emission
(d) projecting a patterned optical projection grid upon the target fabrication object's proximal surface;
(e) providing a movable nanofabrication element carrying an optical sensor array on a selected surface
(f) detecting at least a portion of said patterned optical projection grid when projected upon said movable nanofabrication element's optical sensor array, and, in response to said detection, generating projection grid position data; and
(g) providing a computing device configured to receive said projection grid position data; and
(h) cross correlating said patterned optical projection grid and said projection grid position data to determine a location for said nanofabrication element relative to said fabrication object's proximal surface.

11. The method for sensing position of a nanofabrication element of claim 10, further comprising using an imaging chip to sense the optical projection grid to determine the position of the imaging chip.

12. The method for sensing position of a nanofabrication element of claim 11, further comprising determining the x,y,z position of the imaging chip using cross-correlation of the imaged pattern and the optical projection grid, with respect to center of the grating pattern.

13. The method for sensing position of a nanofabrication element of claim 11, further comprising placing a plurality of imaging chips on multiple locations, both on probe and on fabrication object's proximal surface to determine relative positions with respect to markers on surface.

14. The method for sensing position of a nanofabrication element of claim 11, further comprising:
modulating the patterned optical projection at a selected modulation frequency, to generate a modulated projection;
detecting said modulated projection in the pattern, and heterodyning said detected signal.

15. The method for sensing position of a nanofabrication element of claim 11, wherein step (d) comprises projecting a precise patterned optical projection between said optical pattern generator and said target fabrication object's proximal surface, to provide a precise optical gauge which provides absolute three dimensional position information for said nanofabrication element.

16. A method for detecting the position of a fabrication element, comprising:
(a) generating an optical emission;
(b) providing an optical pattern generator, and illuminating said optical pattern generator with said optical emission;
(c) providing an optical sensor array;
(d) projecting a patterned optical projection upon the optical sensor array;
(e) providing a fabrication element and a fabrication mount to which a target fabrication object can be secured, wherein the fabrication element and the fabrication mount can move relative to one another, and wherein the position of the projected optical pattern relative to one and the position of the optical sensor array relative to the other is known;
(f) detecting at least a portion of said patterned optical projection when projected upon said optical sensor array, and, in response to said detection, generating projection pattern position data;
(g) providing a computing device configured to receive said projection pattern position data; and
(h) cross correlating said patterned optical projection and said projection pattern position data to determine a location for said fabrication element relative to said fabrication mount and to any target fabrication object secured thereto.

17. The method for sensing position of a nanofabrication element of claim 16, wherein step (b) comprises projecting a precise patterned optical projection between said optical pattern generator and said target fabrication object's proximal surface, to provide a precise optical gauge which provides absolute three dimensional position information.

* * * * *

UNITED STATES PATENT AND TRADEMARK OFFICE
CERTIFICATE OF CORRECTION

| | |
|---|---|
| PATENT NO. | : 8,456,650 B2 |
| APPLICATION NO. | : 13/062832 |
| DATED | : June 4, 2013 |
| INVENTOR(S) | : Amit Lal et al. |

Page 1 of 1

It is certified that error appears in the above-identified patent and that said Letters Patent is hereby corrected as shown below:

In the Claims

Column 12, claim 7, line 45, reads "a an atom." Please delete "a" and keep "an".

Signed and Sealed this
Eighteenth Day of February, 2014

Michelle K. Lee
*Deputy Director of the United States Patent and Trademark Office*